US008762088B2

(12) United States Patent
Massey et al.

(10) Patent No.: US 8,762,088 B2
(45) Date of Patent: Jun. 24, 2014

(54) MOCA QUALITY INDEX MEASUREMENT SYSTEM FOR QUALIFYING HOME NETWORKS

(75) Inventors: Gregory W. Massey, Greenfield, IN (US); Daniel K. Chappell, Greenwood, IN (US); Richard Earl Jones, Jr., Plainfield, IN (US)

(73) Assignee: JDS Uniphase Corporation, Milpitas, CA (US)

( * ) Notice: Subject to any disclaimer, the term of this patent is extended or adjusted under 35 U.S.C. 154(b) by 222 days.

(21) Appl. No.: 13/361,763

(22) Filed: Jan. 30, 2012

(65) Prior Publication Data

US 2013/0194936 A1 Aug. 1, 2013

(51) Int. Cl.

| | |
|---|---|
| ***G01R 31/00*** | (2006.01) |
| ***G01N 37/00*** | (2006.01) |
| ***G01R 31/08*** | (2006.01) |
| ***H04N 7/06*** | (2006.01) |

(52) U.S. Cl.
USPC ................................ 702/81; 702/58; 370/252

(58) Field of Classification Search
CPC . H04L 12/2697; H04L 12/2634; H04L 43/50; H04L 43/08; G01R 23/20; G01R 31/31708
USPC .................. 370/252; 375/224, 228, 229, 295; 725/144–147
See application file for complete search history.

(56) References Cited

U.S. PATENT DOCUMENTS

| | | | | |
|---|---|---|---|---|
| 7,154,996 | B2 | 12/2006 | Strauss | 379/93.08 |
| 7,567,613 | B2 | 7/2009 | Fossion et al. | 375/227 |
| 7,577,238 | B2 | 8/2009 | Small et al. | 379/21 |
| 7,583,727 | B2 | 9/2009 | Rekai et al. | 375/225 |
| 7,792,183 | B2 | 9/2010 | Massey et al. | 375/227 |
| 7,873,322 | B2 | 1/2011 | Flask et al. | 455/67.11 |
| 7,912,937 | B2 | 3/2011 | Bullman et al. | 709/224 |
| 7,949,039 | B2 | 5/2011 | Miller et al. | 375/224 |
| 2004/0172242 | A1* | 9/2004 | Seligman et al. | 704/225 |
| 2006/0104339 | A1* | 5/2006 | Langberg et al. | 375/222 |
| 2009/0059933 | A1 | 3/2009 | Huang et al. | 370/401 |
| 2009/0135732 | A1 | 5/2009 | Maxson | 370/252 |
| 2009/0161781 | A1* | 6/2009 | Kolze | 375/260 |
| 2009/0245117 | A1* | 10/2009 | Cooprider et al. | 370/242 |
| 2010/0309805 | A1* | 12/2010 | Jones et al. | 370/252 |

(Continued)

OTHER PUBLICATIONS

Kang et al, An Efficient Bit Loading Algorithm for OFDM-based Wireless LAN Systems and Hardware Implementation Results, Yonsei University, Korea.*

(Continued)

*Primary Examiner* — Hoon J Chung
*Assistant Examiner* — Yaotang Wang
(74) *Attorney, Agent, or Firm* — Matthew A. Pequignot; Pequignot + Myers LLC

(57) ABSTRACT

Systems and methods for quantifying the suitability of a coax network segment to support MoCA communications, comprising: transmitting a test signal associated with MoCA communications through the segment's first end; receiving the test signal through the segment's second end; determining a response function; determining a channel degradation reference based on the highest power level of the response function and a predetermined reference; calculating subcarrier degradation for each MoCA subcarrier, in accordance with the difference between the channel degradation reference and the subcarrier response function; and quantifying the suitability of the segment to support MoCA communications from the first end to the second end in accordance with the subcarrier degradation of all subcarriers in the response function.

20 Claims, 11 Drawing Sheets

(56) References Cited

U.S. PATENT DOCUMENTS

| | | | | |
|---|---|---|---|---|
| 2011/0001833 | A1* | 1/2011 | Grinkemeyer et al. | 348/192 |
| 2011/0193625 | A1* | 8/2011 | Gatta et al. | 330/124 R |
| 2011/0194623 | A1* | 8/2011 | Chih et al. | 375/240.29 |
| 2013/0101007 | A1* | 4/2013 | Zhou | 375/227 |

OTHER PUBLICATIONS

MoCA, Multimedia over Coax Alliance™, CES 2005 Update; pp. 1-20, Jan. 6, 2005, http://www.mocalliance.org.

"Deploying Enhanced Media Service With MoCA; The Challenges and Rewards of MoCA Deployment for the Home Network", CTE Implication Paper, an implication paper prepared for the Society of Cable Telecommunications Engineers by Spirent Communications, http://www.mocalliance.org/marketing/white_papers/Spirent_white_paper.pdf, accessed Dec. 9, 2011.

Lee, MoCA 2.0—Next-gen benefits and enhancements with backward compatibility—Part I, pp. 1-9, Jul. 14, 2011, http://www.etimes.com/General/PrintView4217863.

Ovadia, MoCA—"Home Networking On Coax for Video and Multimedia", overview for IEEE 802.1AVB, pp. 1-15, May 30, 2007, http://www.MoCAlliance.org.

MoCA, "MoCA Protocols: What exactly in this MoCA thing?", Technology Conference & Open House, Austin TX, Nov. 14-15, 2007, http://www.mocalliance.org/industry/presentations/2007_11_14TechConference/docs/MoCAProtocols.pdf.

* cited by examiner

MOCA QUALITY INDEX MEASUREMENT SYSTEM FOR QUALIFYING HOME NETWORKS

FIELD OF THE INVENTION

The present disclosure relates to testing coax cable networks, and in particular to evaluating the suitability of an existing CATV network to support multimedia over coax networking

BACKGROUND OF THE INVENTION

The Multimedia over Coax Alliance (MoCA) has developed the MoCA standard for consumer networking using the same coax cable that provides cable television (CATV) throughout a consumer's home or premises. MoCA signals may coexist with other signals within the same coax cable network. MoCA is a complex data protocol whose performance generally cannot be determined by performing standard RF signal tests.

It is inefficient to first install MoCA networking equipment and then try to use that equipment to determine which segments of coax network wiring, if any, need upgrading or repair. In some sufficiently degraded coax networks, the freshly installed MoCA networking equipment may not be able to acquire a connection or provide its own testing features.

Before installing MoCA networking equipment, it is desirable to test each segment of coax wiring which may carry the MoCA signals to determine whether each segment will provide adequate MoCA performance and to identify those segments which may need upgrade or repair.

SUMMARY OF THE INVENTION

The present disclosure describes testing methods and systems to quantify the suitability of a coax network segment to support MoCA communications. In this manner, one can identify potentially deficient segments in a coax network and quantify the suitability of the entire network to support MoCA communications.

An embodiment of the present disclosure provides a method for quantifying the suitability of a coax network segment to support MoCA communications from a first end of the segment to a second end of the segment, the method comprising: transmitting, through the segment's first end, a test signal having power levels and frequencies associated with MoCA communications spanning multiple subcarrier frequency ranges; receiving the test signal through the segment's second end; determining a frequency response function from the transmitting and the receiving; determining a channel degradation reference based on the highest power level of the response function and a predetermined MoCA design reference response; calculating subcarrier degradation, for each subcarrier frequency range in the response function, in accordance with the difference between the channel degradation reference and the response function at the subcarrier's frequency range; and quantifying the suitability of the segment to support MoCA communications from the first end to the second end in accordance with the subcarrier degradation of all subcarriers in the response function.

A further embodiment of the present disclosure provides a system for quantifying the suitability of a coax network segment to support MoCA communications from a first end of the segment to a second end of the segment, the system comprising: a transmitter for connecting to the segment's first end to transmit a test signal having power levels and frequencies associated with MoCA communications spanning multiple subcarrier frequency ranges; a receiver for connecting to the segment's second end to record a received signal in response to transmission of the test signal by the transmitter; a processor for executing non-volatile computer executable instructions; a memory connected to the processor for storing non-volatile computer executable instructions including instructions for: receiving the test signal; receiving the received signal; determining a frequency response function from the test signal and the received signal; determining a channel degradation reference based on the highest power level of the response function and a predetermined MoCA design reference response; calculating subcarrier degradation, for each subcarrier frequency range in the response function, in accordance with the difference between the channel degradation reference and the response function at the subcarrier's frequency range; quantifying the suitability of the segment to support MoCA communications from the first end to the second end in accordance with the subcarrier degradation of all subcarriers in the response function; and an output connected to the processor and the memory for outputting the results of executing the computer executable instructions.

BRIEF DESCRIPTION OF THE DRAWINGS

Embodiments of the present disclosure are described with reference to the following figures, in which identical reference numerals refer to similar features.

DETAILED DESCRIPTION

While preferred embodiments may be illustrated or described, they are not intended to limit the invention. Rather, numerous changes including alternatives, modifications and equivalents may be made as would be understood by the person skilled in the art. As always, the invention is defined by the appended claims.

The present disclosure describes systems and methods to measure the frequency response of a coax network and generate a MoCA Quality Index (MQI). In order to evaluate the suitability of a segment of a coax network for MoCA-compliant devices, the MQI estimates MoCA degradation and throughput from the frequency response measurements.

There are several reasons to estimate MoCA performance using MQI instead of measuring MoCA performance after installing MoCA enabled hardware in a coax network. The equipment used to measure MQI is simpler and less expensive than that needed to measure MoCA performance. MQI measurements can be performed much faster than a MoCA-compatible transceiver, transmitter, receiver or other MoCA hardware can come online. MoCA performance over a segment of a coax network depends on several related factors that can be difficult to measure. Using MQI as a proxy for MoCA performance, improvements to a network, or a segment of a network, can be more quickly identified and then corrected to improve the network's MoCA performance. Similarly using MQI, a network, or a segment thereof, can be more quickly identified as suitable for MoCA communications.

Figure 1:
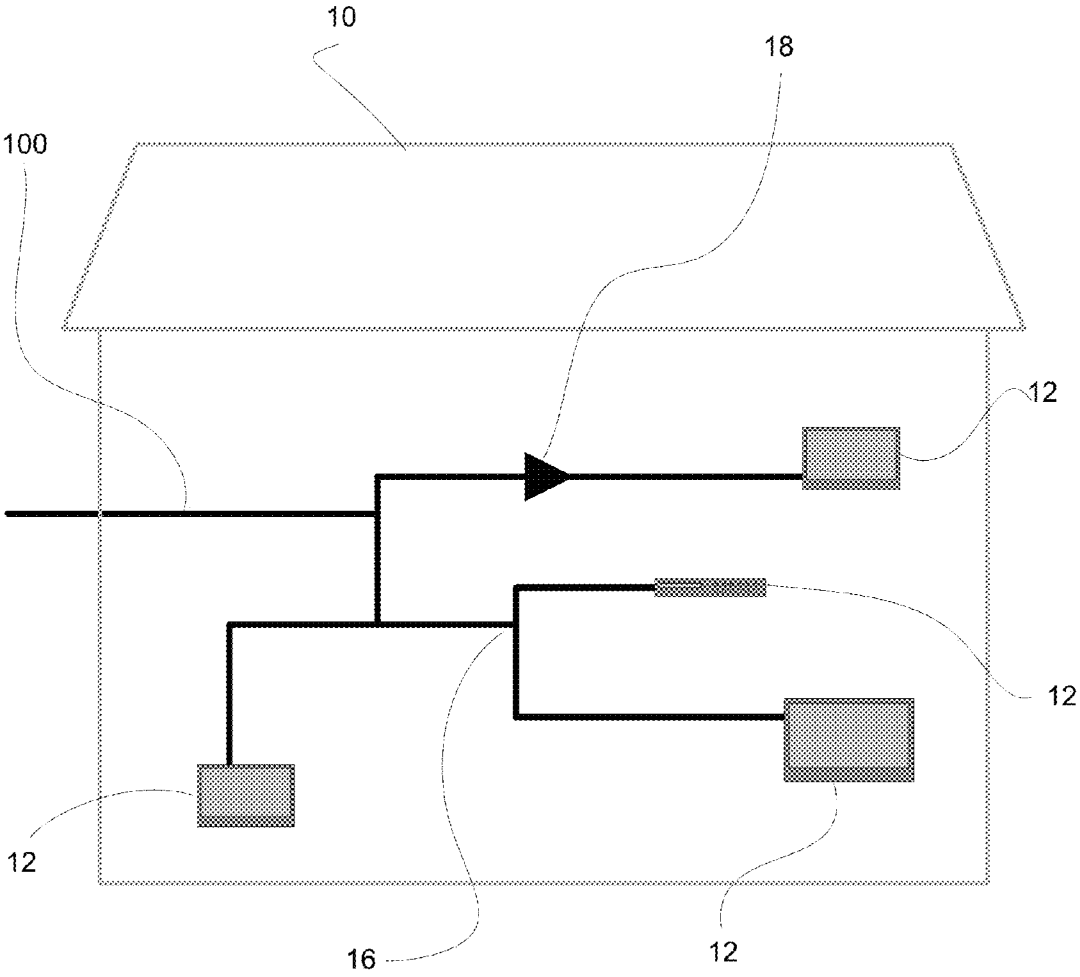
FIG. 1 is a block diagram illustrating an example network environment in which embodiments of the present disclosure may be practiced.

FIG. 1 illustrates a typical coax cable network 100, such as a CATV network, in a consumer home premise 10. For simplicity, this disclosure describes MoCA networks in the context of a consumer home; however, other environments for a MoCA network are contemplated without deviating from the invention including any coax cable network environment. The various devices 12, such as televisions, set top boxes, DVRs, PVRs, media centers, home computers, internet bridges, routers and other coax network equipment are all connected to endpoints of the coax network 100 running through the premises 10. A coax network segment is defined between any two endpoints in the coax network 100 and may have directional properties due to splitters 16, amplifiers 18 and other components that may form part of the coax network 100 and may have directional response characteristics. A coax network segment may also be defined between any two endpoints of coax cable that has been separated out of the coax network 100 for testing.

Figure 2:
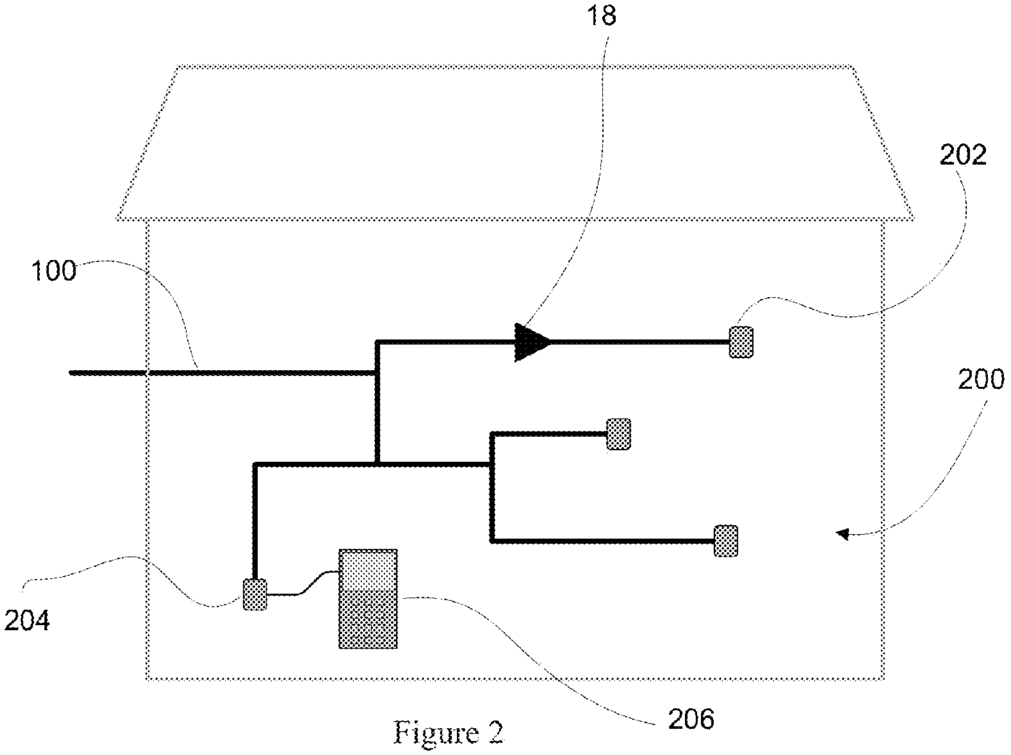
FIG. 2 is a block diagram illustrating an embodiment of the present disclosure in the example network environment of FIG. 1.
Figure 3:
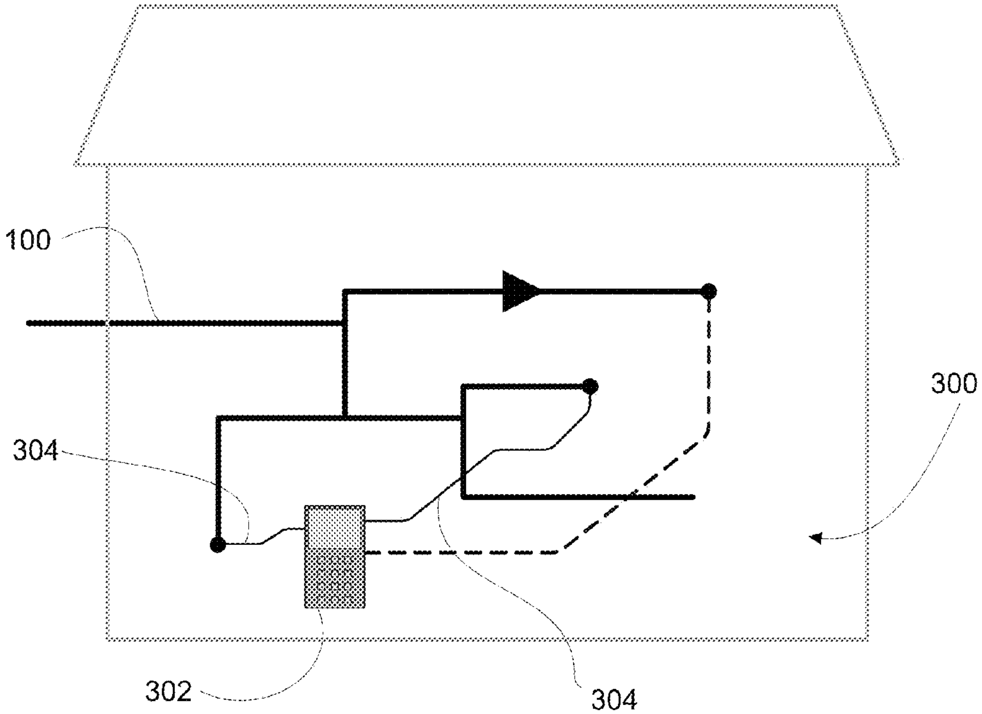
FIG. 3 is a block diagram illustrating a further embodiment of the present disclosure in the example network environment of FIG. 1.

Referring now to FIGS. 2 and 3, the coax network 100 of FIG. 1 is illustrated with the various devices 12 disconnected, absent or removed. To determine if the network 100 can support MoCA communications, measurement systems 200, 300 transmit RF signals at known power levels over a range of frequencies through one or more of the coax network segments. The measurement systems 200, 300 measure the power levels of those signals received at other endpoints in the network 100 and determine a frequency response function. Because the coax network 100 may have directional response characteristics, the measurement systems 200, 300 may transmit test signals from each coax endpoint to all other endpoints in the network 100 such that each pair of endpoints is measured in both directions. The measurement systems 200, 300 analyzes the measurements in order to quantify the suitability of the network (or at least of one coax segment in one direction) to support MoCA communications. The analysis may also determine an MQI (MoCA Quality Index) score along each communication path. Measurement systems 200, 300 may have other uses besides determining MQI scores. They could also report frequency responses directly or perform distance measurements, such as using frequency domain reflectometry (FDR). The measurement systems 200, 300 may also run appropriate software to perform these and other complementary functions in addition to determining suitability for MoCA communications and/or computing MQI scores for the coax network or its segments.

A distributed measurement system is illustrated in FIG. 2. The measurement system 200 comprises a series of transceivers 202, 204 and an analyzer 206. Each transceiver 202, 204 can generate test signals, measure signals generated by other transceivers, and may communicate with other transceivers and/or the analyzer 206 in order to coordinate signal transmissions with measurements. Communication may be via modulated RF carrier over the coax network 100 or short-range wireless technology such as WiFi. Each transceiver 202, 204 may contain a processor capable of controlling a transmitter and a receiver and control communicating with other transceivers in the system, if necessary. Accordingly, a single transceiver 202 can transmit a sequence of test signals and all other transceivers can measure simultaneously, thus generating the data needed to qualify all network paths. In order to analyze networks with directional frequency response devices such as amplifiers 18, each transceiver 202, 204 would transmit a sequence of test signals in turn and all other transceivers would measure. Synchronization or transceiver to transceiver communication may not be necessary if communications are managed by the analyzer 206 or if a transceiver 202, 204 can detect transmission and commence measurements.

As illustrated in FIG. 2, one transceiver 202, connects to a first endpoint of the coax network and transmits a test signal having known or predetermined power levels and frequencies through the coax network. A second transceiver 204, connects to another endpoint of the coax network, defining a coax network segment between the first and second endpoints. The second transceiver 204 receives the test signal through the network 100 and may record a received signal. The analyzer 206 receives the original test signal transmitted by the transceiver 202 (or may have prior knowledge of the test signal) and receives the signal as received by the transceiver 204 and performs analysis and output described in greater detail below. Transceivers 202, 204 may be replaced with separate transmitters and receivers; however, this is less efficient, as the transmitter/receiver pair must be exchanged at different ends of the network segment to test in the opposite direction.

The analyzer 206 comprises a processor, memory, an input mechanism and an output mechanism such as a display, printer, external communication port, or the like. The processor connects to the memory to run computer executable instructions stored in a non-volatile memory. The processor connects to the input mechanism to receive test signals and received signals from transceivers 202, 204 and may store those signals in the memory. The processor also connects to the output mechanism to output measurements or print or display results of executing the instructions, for example, displaying the MQI score after analysis of the coax network 100. The processor, through the computer executable instructions stored in memory, may be used to analyze data from the measurement transceivers, determine a frequency response function from the transmitted and received signals, and determine MoCA communication suitability, such as an MQI score, for each communication path. The analyzer 206 may contain a transceiver 202, 204, or it may communicate with one or more of the transceivers 202, 204 in the measurement system 200 via standard data network technologies such as USB.

The analyzer 206 may receive the test and received signals through the input mechanism in any manner. For example, a direct wired or wireless connection may exist with the transceivers 202, 204. The analyzer 206 may receive these signals indirectly by serial or other data transfer, by physical media transfer, by email, or any other transmission after the two transceivers 202, 204 have performed measurements. The analyzer 206 may also receive the signals over the coax network 100.

The configuration illustrated in FIG. 2 has the advantage that a technician can install transceivers 202, 204 at each endpoint of the network 100 and, if each transceiver 202, 204 can wirelessly or otherwise communicate with the analyzer 206, then the technician can remotely orchestrate transmission and reception of test signals in both directions through all network segments without needing to adjust the configuration of the transceivers 202, 204 and the analyzer 206. As illustrated in FIG. 2, the analyzer 206 is directly connected to a transceiver 204. In alternative embodiments, the analyzer 206 may also contain a transceiver and be connected directly to an endpoint of the coax network 100.

FIG. 3 illustrates a single device implementation of a measurement system 300 where a test unit 302 comprises a transmitter, a receiver and the analyzer 206. Additional cables 304 connect the test unit 302 to two or more endpoints of the coax network 100. If the test unit 302 contains multiple transmitters, receivers or I/O ports for additional cables 304, it may measure frequency response on two or more network segments. This embodiment may be of greater advantage where all endpoints of the coax network are proximate; however, a disadvantage of this measurement system 300 is that signal losses from transmission through the additional cables 304 should also be taken into account when analyzing the network 100. This measurement system 300 may be inconvenient because a technician must run these additional cables 304 through the network environment to each endpoint. This measurement system 300 may be implemented by programming a network analyzer with instructions to compute an MQI score or estimate throughput of the path between the two network endpoints being tested. Agilent and Rhode & Schwarz make network analyzers that could be used in this manner; however they are expensive in comparison to an independent analyzer 206 contemplated in the present disclosure.

Many variations of the measurement systems 200, 300 described above are possible. A single transmitter attached to one endpoint could sweep through all frequencies without attempting to coordinate or synchronize with receivers attached at other endpoints. The receivers could monitor and record the signals and transfer results to an analysis device at a later time.

Figure 4:
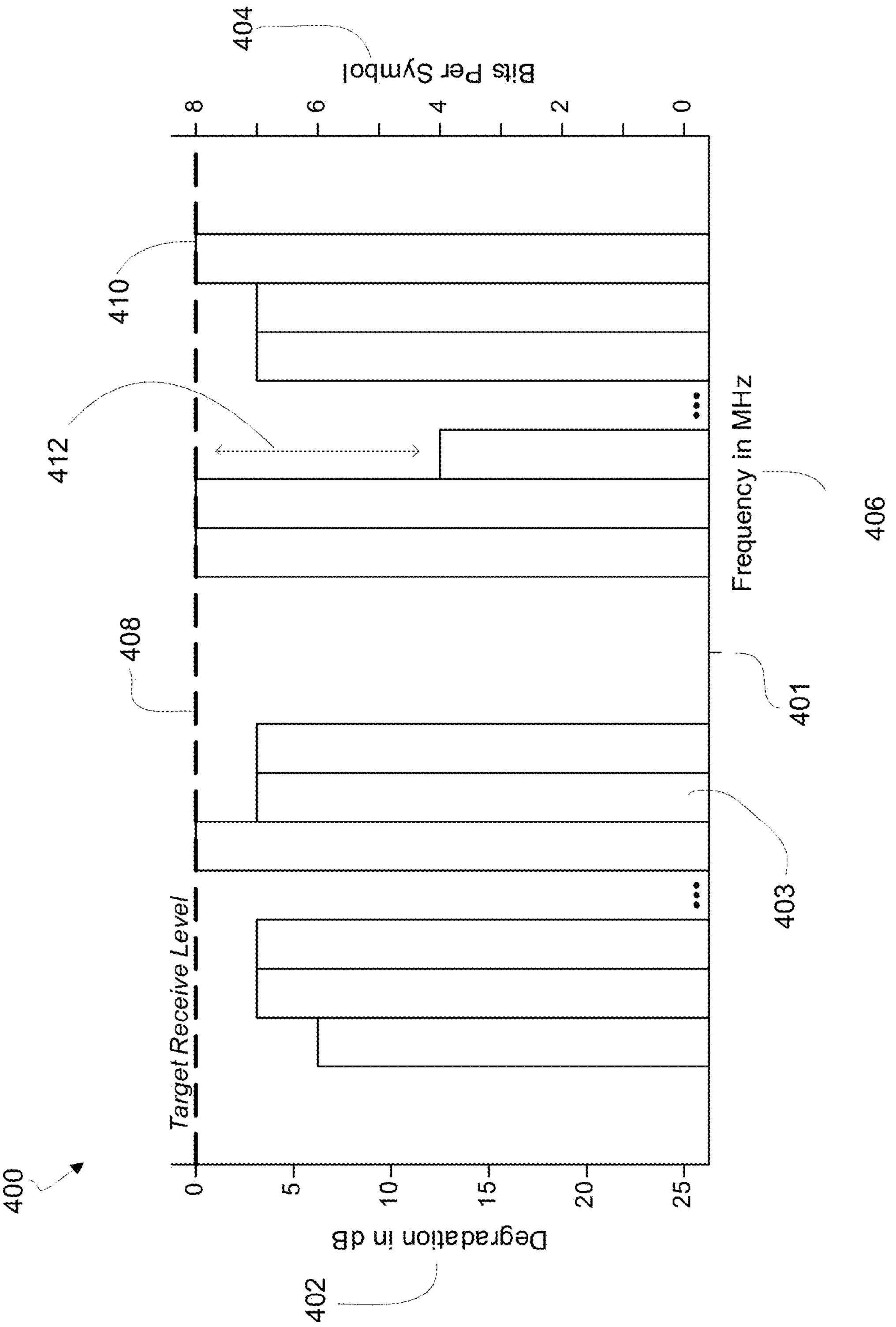
FIG. 4 is a frequency graph illustrating example MoCA subcarriers' contributions to throughput.

Referring now to FIG. 4, this figure illustrates an example of a MoCA communications' subcarrier degradation in decibels on the left axis 402 and the subcarrier's corresponding number of bits per symbol on the right axis 404. The bottom axis 406 illustrates channel frequency about the center frequency 401. In order to quantify the suitability of a coax network 100 to support MoCA communications, the present disclosure assumes a simplified model of a MoCA transmitter/receiver pair. Under the MoCA 1.x standards, a 50 MHz channel is centered about a center frequency 401 divided into 256 equally-spaced subcarrier frequency ranges each having a bandwidth of 195.3 kHz. MoCA communications use two equal-width frequency bands of 112 subcarriers 403, placed symmetrically around the channel's center frequency 401, half above the center frequency 401, and half below it. Consequently, there are also some unused subcarriers (not shown) as there is a total of 256 subcarriers and only 224 are being used. Further information describing the MoCA 1.0 and 1.1 (collectively 1.x) standards is available online at various sources including: http://www.mocaliance.org, http://www.mocalliance.org/industry/presentations/2007__11__14_TechConference/docs/MoCAProtocols.pdf, http://www.mocalliance.org/marketing/white_papers/Spirent_white_paper.pdf and http://www.etimes.com/General/PrintView4217863 (collectively last accessed Dec. 9, 2011) each of which are herein incorporated in their entirety.

MoCA transmitters may vary their transmission levels in 1 dB nominal steps. Each MoCA transmitter has a table of levels it uses when transmitting to different receivers in the network 100. A MoCA transmitter sets and adjusts these levels based on feedback from the MoCA receivers. The highest received level of any subcarrier 403 within the channel is identified as the reference level 410. A MoCA receiver sends feedback to a MoCA transmitter to increase its transmission power in order to try to maintain this reference level at a target receive level (TRL) 408. In FIG. 4, the reference level 410 of the channel is the same as the TRL because some subcarriers 403 were received at the TRL.

Using feedback from a MoCA receiver, a MoCA transmitter assigns a modulation format appropriate for the received signal level for each subcarrier 403. MoCA attempts to maximize the throughput of a transmitter-receiver pair by using the highest modulation format (the most bits per symbol) with subcarriers 403 that have the highest received signal level. MoCA uses lower modulation formats (fewer bits per symbol) with subcarriers 403 whose received signal levels are below the target receive level 408. As the amount of subcarrier degradation increases, the number of bits per symbol that may be transmitted using that subcarrier 403 decreases. If the path loss in the coax cable segment under test is too great, despite the transmitter using its maximum transmission level (MTL), the reference level may still be below the target receive level (TRL) 408.

The subcarrier degradation 402, 412 may also be considered as the difference between the target receive level (TRL) 408 and the actual received signal level 410 for that subcarrier 403. The greater the subcarrier degradation 402, 412, the fewer the bits per symbol 404 that that subcarrier 403 may carry. In some embodiments of the present disclosure, the unused subcarriers may be assigned 0 bits to reflect their unused status. Any subcarrier with too much degradation 402, 412 may also be assigned 0 bits per symbol 404.

The modulation formats, or number of bits per symbol, for all subcarriers in the channel make up a modulation profile for the coax network segment under test in the direction of the MoCA transmitter to the MoCA receiver. In addition to a transmit level table, each MoCA transmitter has a table of modulation profiles it uses when transmitting to different MoCA receivers in the network. Neglecting packet losses, the set of modulation formats for all subcarriers in the channel determines the throughput for the channel. Maximum throughput may be achieved when all the subcarriers can use the highest modulation format.

MoCA transmitters may also apply pre-equalization to their MoCA transmissions in order to reduce the effects of irregularities in the channel's frequency response and improve throughput for each subcarrier 403. This pre-equalization is limited in both dynamic range and frequency resolution, so it may not overcome severe irregularities.

With this simplified model of the MoCA 1.x standard, the present disclosure provides systems and methods for evaluating a coax network's suitability for MoCA networking. The present systems and methods may identify segments of a home coax network which are unsuitable for MoCA communications by performing frequency response measurements in lieu of measuring the performance of installed MoCA networking equipment. The present systems and methods may generate a MoCA suitability metric, called a MoCA Quality Index (MQI) based on the frequency response measurements.

Figure 5:
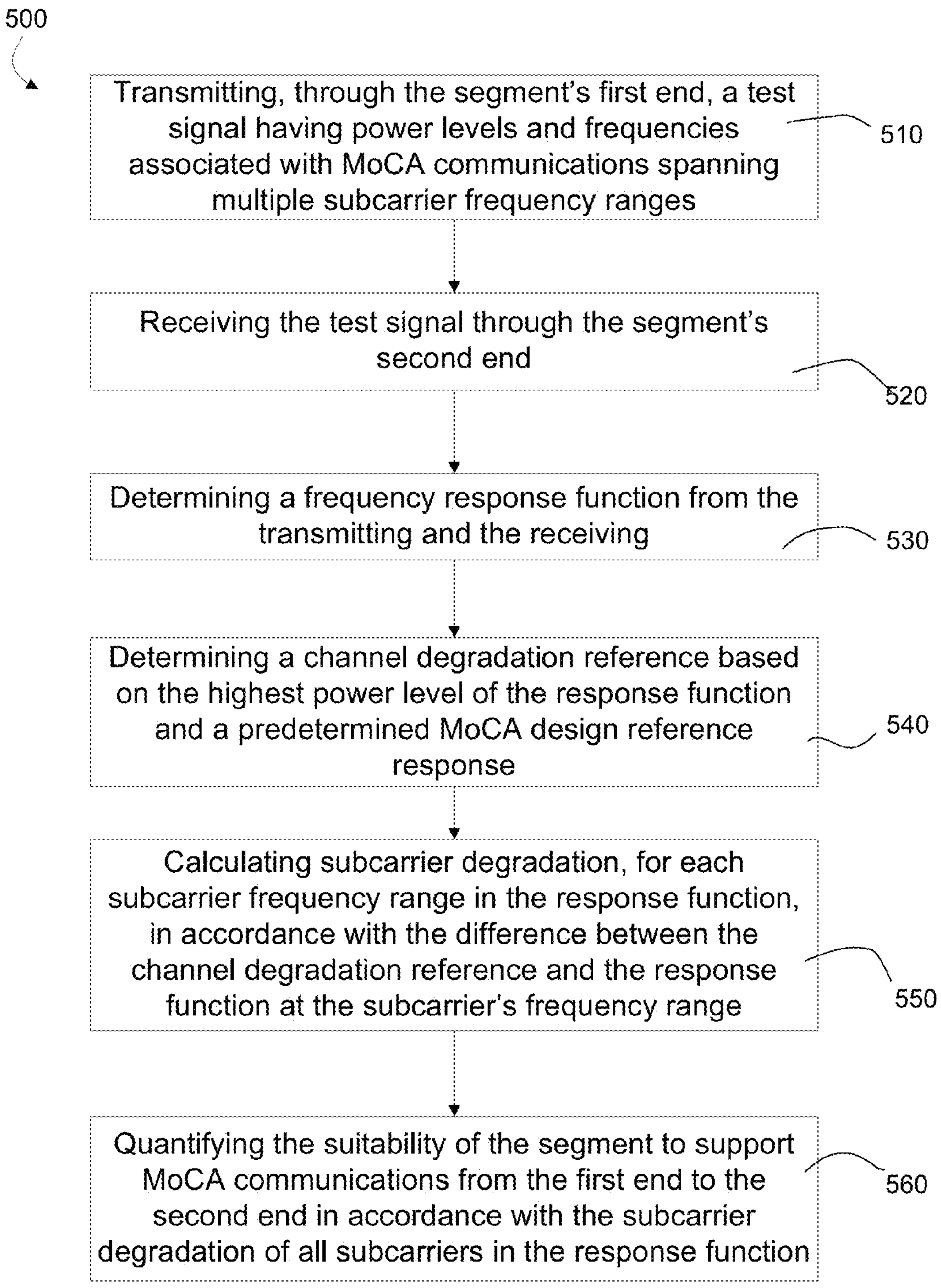
FIG. 5 is a flowchart illustrating an example process according to the present disclosure.

Referring now to FIG. 5, an example process 500 according to the present disclosure is illustrated. Process 500 quantifies the suitability of a coax network segment to support MoCA communications from a first end of the segment to a second end of the segment. Process 500 may be applied to a coax network 100, or a segment of coax network cabling, using transceivers 202, 204 and analyzer 206, test unit 300 or it may be applied in other ways. Process 500 may be applied before MoCA equipment is installed, thus saving a technician the trouble of installing MoCA equipment only to discover the coax network 100 cannot sufficiently support MoCA. Other scenarios for applying process 500 are equally applicable.

At 510, a test signal having power levels and frequencies associated with MoCA communications spanning multiple subcarrier frequency ranges is transmitted through the segment's first end into the cable network 100. For example, a transceiver 202 may be connected to the first endpoint of a coax network 100 and may coordinate with another transceiver 204 or with an analyzer 206 to commence transmission of the test signal. The test signal may comprise a series of known power levels at frequencies corresponding to each subcarrier frequency range in the MoCA channel. Some embodiments of the present disclosure use a fixed calibrated transmit power of 50 dBmV for compatibility with receiver sensitivity and dynamic range. Other embodiments may use a lower transmit power of 40 dBmV for certain other tests to reduce the risk of overdriving any amplifiers in the network being tested. Other predetermined power levels may also be used. Although it is more thorough for the test signal to transmit on at least one frequency for each subcarrier, it is not necessary for the test signal to include at least one frequency for each subcarrier because a response function may be interpolated or estimated between other measured points. As discussed below in respect of compensating for tilt effects, instead of (or in addition to) having test signal frequencies at center frequencies of the subcarriers, the test signal frequencies may correspond to the edge frequencies of each subcarrier to determine tilt across each subcarrier.

At 520, the test signal is received through the segment's second end. Receiving 520 may include recording the signal as a received signal. A receiver, transceiver 204, analyzer 206 or test unit 302 may perform the receiving 520. Receiving 520, may be synchronized to occur in coordination with transmitting 510. This may be achieved by handshaking between the transmitting device and a receiving device if those devices are not the same device, or in various other manners. In some other embodiments, there may be no coordination of receiving 520 and transmitting 510. In yet further embodiments, the receiving 520 may be commenced when a receiving device detects an incoming transmission.

At 530, a frequency response function is determined subsequent to the transmitting 510 and the receiving 520. The frequency response function is determined from the test signal and the received signal which may be acquired in any manner by the device determining 530 the response function. In some embodiments, the analyzer 206 receives the test signal and the received signal from transceivers 202, 204 which may or may not be the same device as the analyzer 206. Determining 530 a frequency response function may occur concurrently with transmitting 510 and receiving 520 or may occur after those actions have completed.

In some embodiments, determining 530 a frequency response function may further comprise adjusting the response function to compensate for MoCA adaptive equalization, pre-equalization or tilt effects, performing near-noise corrections, band-averaging the response function values, averaging left and right traces of the response function values, slope-limiting the traces or the response function, or any combination of the preceding adjustments.

At 540, a channel degradation reference is determined based on the highest power level of the frequency response function determined at 530 and a predetermined MoCA design reference response (DRR).

At 550, a subcarrier degradation is calculated for each subcarrier frequency range in the response function. The calculating 550 is in accordance with the difference between the channel degradation reference determined at 540, and the frequency response function at the subcarrier's frequency range.

At 560, the suitability of the segment to support MoCA communications (directionally from the first end to the second end) is quantified in accordance with the subcarrier degradation determined at 550 for all subcarriers in the response function. In some embodiments, suitability may be determined by calculating throughput for each subcarrier, summing all the subcarrier throughputs, and generating a MoCA Quality Index (MQI) score. In some embodiments, actions 510-550 are repeated and the results averaged to generate a quantification or MQI score at 560.

In some embodiments, actions 530, 540, 550 and 560 may be performed by the analyzer 206 or the test unit 302. In some embodiments, actions 510 and 520 may be performed by transceivers, 202, 204 by the analyzer 206 or by the test unit 302.

Figure 6:
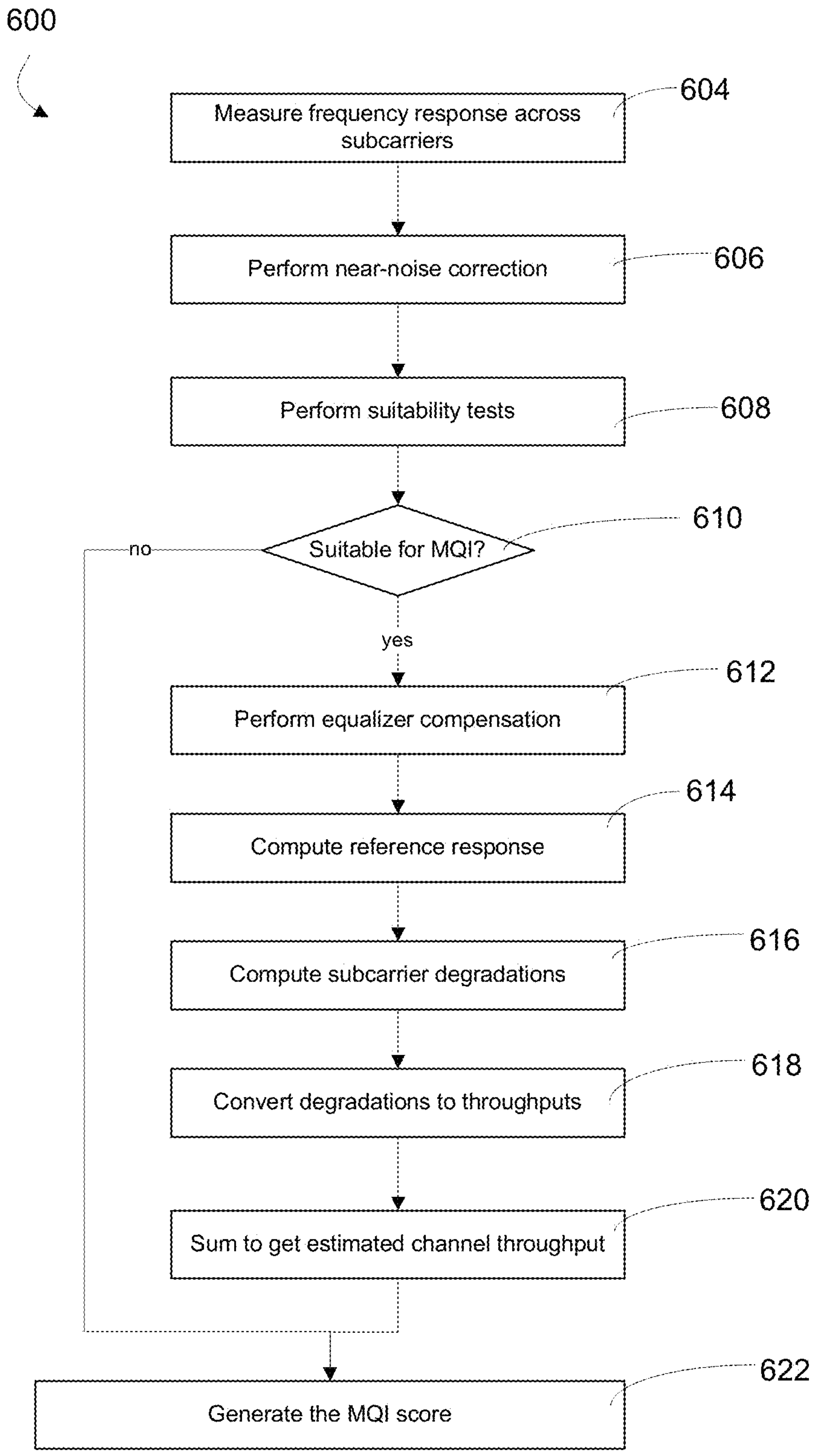
FIG. 6 is a flowchart illustrating another example process according the present disclosure.

Referring now to FIG. 6, a flowchart illustrates a process 600 according to an embodiment of the present disclosure. The process commences at 604 measuring the frequency response across subcarriers. A frequency response function describes the difference, in decibels, between the received signal and the transmitted test signal. By working with response functions instead of received signals, embodiments of the present disclosure may not need to model either the MoCA transmitter's transmission level or the MoCA receiver's target receive level (TRL).

In order for embodiments of the present disclosure to measure or estimate the frequency response function, the test signal transmitted should comprise frequencies spanning the MoCA subcarrier frequency ranges. To measure the responses of all 224 subcarriers 403 of a MoCA 1.x channel, the test signal may comprise frequencies in each of the subcarriers 403. In some embodiments the frequencies at the centers of each subcarrier may be used. In other embodiments, the edge frequencies of each subcarrier may be used. In some embodiments frequencies for less than all of the subcarriers may be used and frequency response function values may be estimated, extrapolated or interpolated based on the measured values. In some embodiments, frequencies may be included in the test signal for subcarriers that are unused in MoCA communications to permit performing equalizer compensation or to improve accuracy of analysis and/or interpolation of the subcarrier 403 response function values.

The process 600 optionally performs near noise correction at 606 and optionally performs suitability tests at 608. If suitability tests are performed at 608, the process queries at 610 whether the response function is suitable for analysis. If the process is not suitable for analysis, the process skips to 622 where a quantification or an MQI score is generated indicating the cable segment under test in the direction under test is not suitable for MoCA communications, for example, by assigning an MQI score of 0. If the frequency response function is suitable for analysis, the process 600 proceeds to 612. In some embodiments, further suitability tests may occur at other stages of process 600 including during any adjustments, interpolations or extrapolations of the response function.

Embodiments of the present disclosure may perform near-noise correction 606 and/or suitability analysis 608. Generally, the equipment used to measure response has a limited dynamic range. This limit is a function of transmitter output power, receiver sensitivity, receiver resolution, and noise present on the network. Transmitter output power is not necessarily constant over the frequencies spanned by the MoCA channel. The received power on the network can be measured with the transmitter turned off. The minimum measurable response at a given frequency can be calculated from the transmitter's output power. This may be used to identify whether the measured frequency response is limited by the dynamic range of the measurement equipment or by steady-state noise present on the network.

Let $M_f$ be the measured response function at frequency f, expressed in decibels. Let $L_f$ be the lowest measurable response. Then the noise-corrected response $R_f$ is given by $R_f = \log(\exp(M_f) - \exp(L_f))$, assuming that $M_f > L_f$. Since $M_f$ and $L_f$ are measured values with some amount of uncertainty, embodiments of the present disclosure must handle the case in which the inequality does not hold. When that occurs, $R_f$ can be set to a constant value below the lowest expected $L_f$. A MQI score will not be degraded by a few such points in the response data; however, if there are many such points, the response function data may be unsuitable for quantifying suitability for MoCA communications. In some embodiments, response functions are rejected as unsuitable if, for about half or more of the response function data points, $M_f < L_f + 1$ dB. If the response function data is deemed suitable, the response function may be adjusted to compensate for near-noise correction by replacing the response function with the noise-corrected response function $R_f$.

At 612, the process 600 optionally compensates for MoCA's equalization effects. In some embodiments of the present disclosure, the effect of pre-equalization is modeled by dividing the MoCA channel into a number of equal-width frequency bands. Kappa (κ), the number of frequency bands, is the first of seven control parameters that permit tuning an MQI model to match experimental results. For convenience, these seven control parameters are assigned Greek letters. Another two control parameters related to modeling equalizer compensation are a maximum amount of equalizer adjustment in dB per MHz, which is identified by mu (μ), and a compensation limit in dB, identified by phi (ϕ), for equalizer compensation. More control parameters will be introduced as they are needed.

Referring now to the four graphs of FIG. 7, the actions below describe an example process 700 for computing an equalization curve:

(1) Divide the frequency response function 702 that includes all frequency response values associated with the MoCA channel into κ equal-width bands 702. As partially illustrated in graph (i) of FIG. 7, an embodiment of the present disclosure measures response function values including 226 edge frequencies of the 224 subcarriers and edge frequencies of some of the unused subcarriers. All the response function values are grouped into 9 equal-width bands 704.

(2) Average all the measured subcarrier responses signal values that fall within each of the κ frequency bands. As illustrated in graph (ii) of FIG. 7, the averaged values for each band are represented as solid dots 706.

(3) Starting with the leftmost (lowest frequency band) average value 706, trace linearly to the right (highest frequency band) through the average values 706 as close as possible to the next average value 706 without exceeding a slope of ±μ dB per MHz. In graph (ii) of FIG. 7, the right trace 708 is illustrated by connected arrows. Where the slope to the next average value 706 would have exceeded ±μ dB per MHz, an adjusted value 710 limited to the maximum slope is used. The adjusted value 710 is illustrated as a hollow circle in graph (ii).

Figure 7:
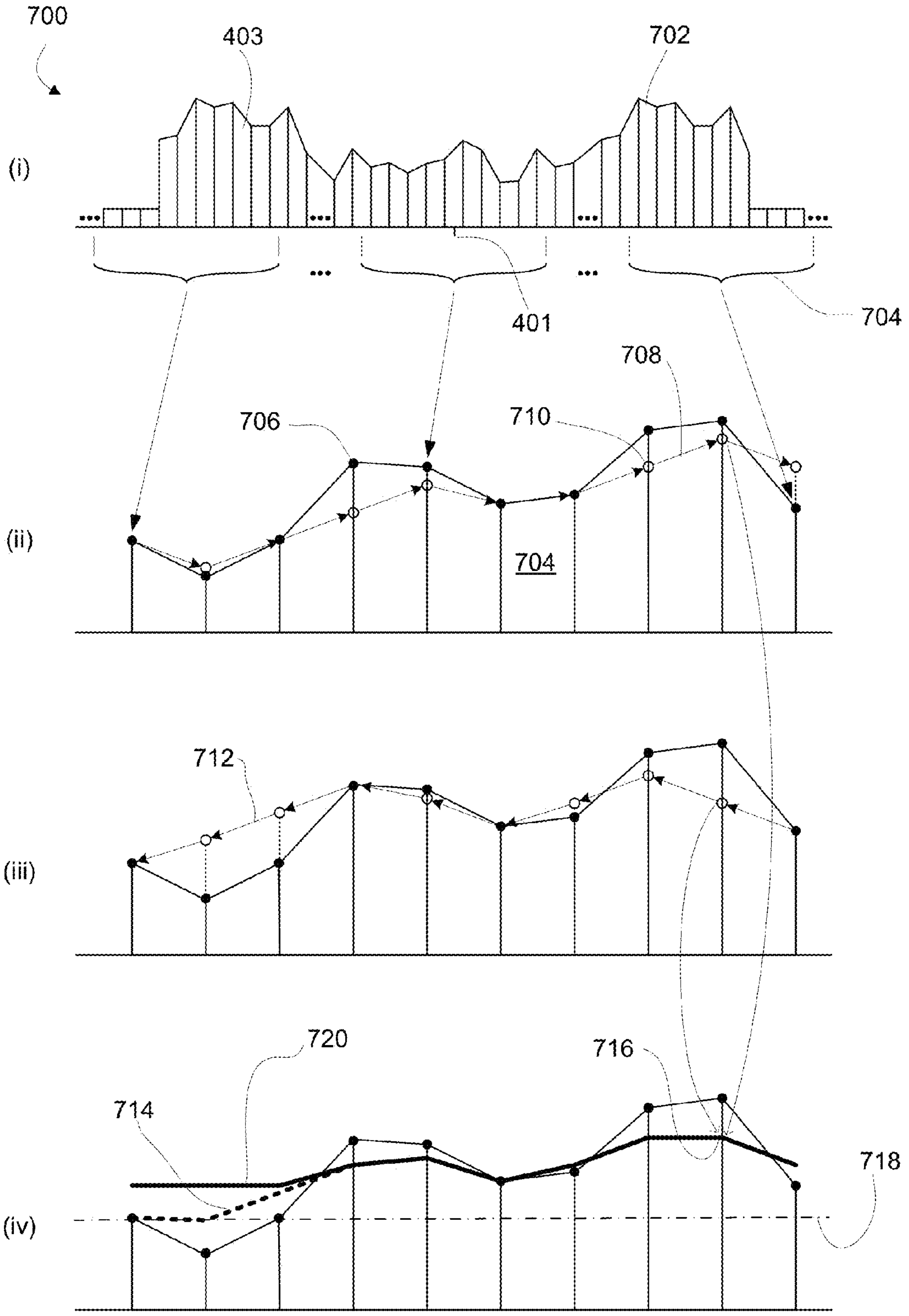
FIG. 7 is a series of frequency graphs illustrating calculating an equalization curve according to an embodiment of the present disclosure.

(4) Repeat the tracing action starting with the rightmost average value 706, move left through the average values 706 with the same restrictions to generate a right trace 712 as illustrated in graph (iii) of FIG. 7.

(5) Average the values of the left trace 708 and the right trace 712 at each of the κ frequency bands. The average of the two traces creates an equalization curve 714 illustrated as a dashed line in graph (iv) of FIG. 7.

(6) Find the highest value 716 in the equalization curve 714. Subtract ϕ from the highest value 716 to get a lower bound 718. Replace each point of the equalization curve 714 with the greater of the value from the equalization curve 714 and this lower bound 718. As shown in graph (iv), the equalization curve 714 drops more than ϕ dB below the highest point 716 at its three left-most points. Accordingly, these points are adjusted up to the lower bound 718. The result forms the adjusted equalization curve 720.

(7) Compute the average level of the adjusted equalization curve 720 in the linear domain (not illustrated) and convert the average to dB (not illustrated).

(8) Adjust each response function by subtracting from each response function value 702 the decibel converted average of the lower-bounded equalization curve.

As illustrated in graph (i) of FIG. 7, all of the subcarrier frequencies about the center frequency 401 have measured response values while some subcarriers at the extremities of the channel do not. MoCA communications may not use some of the subcarriers that are measured. At the same time, some of the unused subcarriers at the extremities of the channel may have no measured response values but are nonetheless included in the κ frequency bands 704 of the MQI model. Measuring the equalization curve including values for unused subcarriers, if any, about the center frequency 401 and omitting values for some unused subcarrier frequencies at the channel extremities, if any, has several advantages. First, continuity across the center frequency 401 between the two bands of subcarriers 403 is provided by measuring all subcarriers about the center frequency 401. Second, the zero values at the channel extremities bias the averaged values 706 at the outer edges of the two MoCA frequency bands towards the center frequency 401 so that the extrapolations at the edges will not negatively affect the predicted MoCA performance. Third, including zero value extremity frequencies permits larger κ values and helps avoids reducing the number of measured response function values to be averaged in each κ band 704 below two (which would render averaging the values in each κ band 704 band redundant). Also, including these unused frequencies, if any, simplify this embodiment of the MQI model by making the spacing of the average values 706 uniform.

Figure 8:
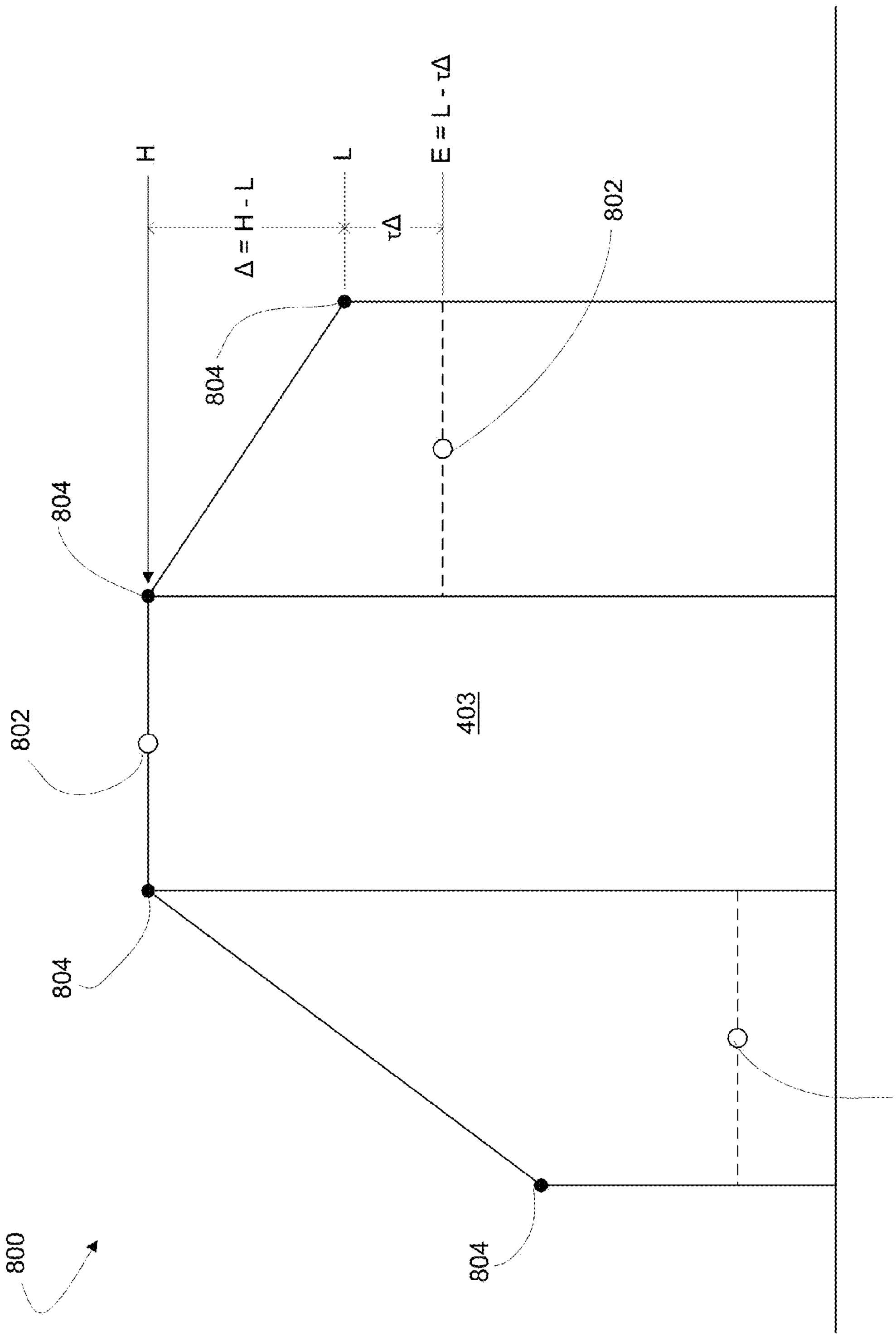
FIG. 8 is a frequency graph illustrating calculating tilt compensation according to an embodiment of the present disclosure.

Referring now to FIG. 8, a graph 800 of three example subcarriers 403 illustrates frequency tilt across subcarriers 403 and compensation for tilt. Adjusting the response function values to compensate for tilt is an optional feature. Frequency tilt across a subcarrier 403 is present where there is a difference in the response function between the low and high frequency edges of a subcarrier frequency band 403. In some embodiments, an effective response function 802 for each subcarrier 403 may be calculated or adjusted from response functions 804 that are at, or proximate to the edge frequencies of each subcarrier 403. The response functions 804 may be measured, interpolated or adjusted response function values.

Although MoCA communications use lower than ideal modulation formats for subcarriers with lower than ideal response functions, there is still the possibility that tilt across a subcarrier 403 will degrade the signal and force MoCA to use a lower modulation format. Embodiments of the present disclosure may compensate for tilt by estimating the effects of tilt degradation on the response function. In some embodiments, subcarrier responses are measured at the subcarrier frequency edges rather than the center in order to account for tilt degradation. Any tilt identified may be converted to a reduction from the lower of the edge responses. The amount of reduction may be proportional to the amount of tilt. A subcarrier with no tilt will not be affected by this compensation. The degree of reduction can be varied with a single Tilt Effect Coefficient, or tau ($\tau$) which is another of the MQI model control parameters used to match experimental results.

To determine tilt degradation, the difference ($\Delta$) between a subcarrier's two edge frequencies is calculated. The effective response 802 for the subcarrier is calculated by subtracting $\tau\Delta$ from the weaker of the subcarrier's two edge frequencies 804. This method of tilt degradation compensation has some interesting properties. When $\tau=0$, the effective response 802 is the lower of the responses 804 at the edges of the subcarrier 403. When $\tau=-1$ the effective response is the higher of the two edge responses 804. When $\tau=-0.5$ the effective response 802 is the average of the two edge responses 804. Although this tilt compensation implementation puts no constraints on the value of $\tau$, some embodiments limit $\tau$ between −0.5 and 0.5 for improved accuracy when quantifying MoCA suitability.

Any random variations in measured frequency response levels will cause a lowering of the effective levels of flat subcarriers. If the measured levels have too much random variation, a smoothing algorithm may be used to reduce this effect. In some embodiments, this problem can be detected by measuring the degradation or throughput of the same network segment several times and comparing the results. When compared against a predetermined amount of expected variation, the sensitivity of the quantification or MQI score to this amount of variation can be calculated. If the quantification or MQI score is overly sensitive to these variations, an interpolation function can be used to smooth the measured responses before compensating for tilt.

Returning to process 600 of FIG. 6; at 614, a channel reference response (CRR) is calculated. The channel reference response (CRR) is the highest response value across all subcarriers after all previous adjustments have been made. The CRR represents the lowest degradation in any subcarrier's response function in the channel. The responses used to determine the CRR may be measured at the edges rather than the centers of the subcarriers or the CRR may be based on an interpolated or adjusted response function value.

A further suitability test may optionally be performed when the CRR has been calculated. As discussed above, the equipment used to measure response has limited dynamic range. The dynamic range limitation is a function of transmitter output power, receiver sensitivity and resolution, and noise present on the network. In some embodiments, the dynamic range is expected to be limited to 60 dB. Thus, if the channel reference response (CRR) is less than −60 dB, it may not be possible to estimate MoCA communication quality, and a low or unknown score may be reported. Other conditions may also cause process 600 to abort further analysis and report a low or unknown quantification of MoCA communication suitability: transceivers, transmitter/receiver pairs or analyzers that are unable to sufficiently coordinate the transmitting and receiving in order to perform frequency response measurements; the distance between the transmitter and the receiver, measured (for example) by frequency domain reflectometry (FDR) may be too short or too long; or there may be excessive loss or gain in the network cable segment under test.

At 616, subcarrier degradations are calculated for each subcarrier 403 in the channel. Subcarrier degradations may also be calculated for unused subcarriers, if any. In some embodiments, calculating subcarrier degradations includes determining a channel degradation reference (CDR). In some embodiments, the CDR is the level from which each subcarrier's response function value can be subtracted to get its corresponding subcarrier degradation. The CDR is the maximum value of the CRR calculated at 614, and a predetermined MoCA hardware design reference response (DRR), that is, CDR=max{CRR,DRR}.

The design reference response (DRR) is a predetermined value representing the lowest response function capable of providing full throughput over the MoCA channel. The DRR may be higher than the CRR, implying the network segment under performs the DRR, or the DRR may be lower than the CRR, implying the network segment outperforms the DRR. In some embodiments, the DRR is calculated as the difference between an average value of common MoCA receivers' target reference levels (TRL) and an average value of common MoCA transmitters' maximum transmission levels (MTL); however, it is not necessary to know both the TRL and MTL for MoCA transmitters or receivers so long as the difference between the two is known. Another control parameter of the MQI model, delta ($\delta$) represents an average DRR for MoCA hardware.

To calculate subcarrier degradations at 616, process 600 calculates the difference between the frequency response function (however it may have been adjusted) and the CDR described above. It is possible to quantify the suitability of the network segment to support MoCA communications directly from the subcarrier degradations calculated at 616, for example, by summing the degradations of all subcarriers to determine a total MoCA channel degradation. With greater total MoCA channel degradation, the network segment provides, in that direction, less ideal support for MoCA communications.

Figure 9:
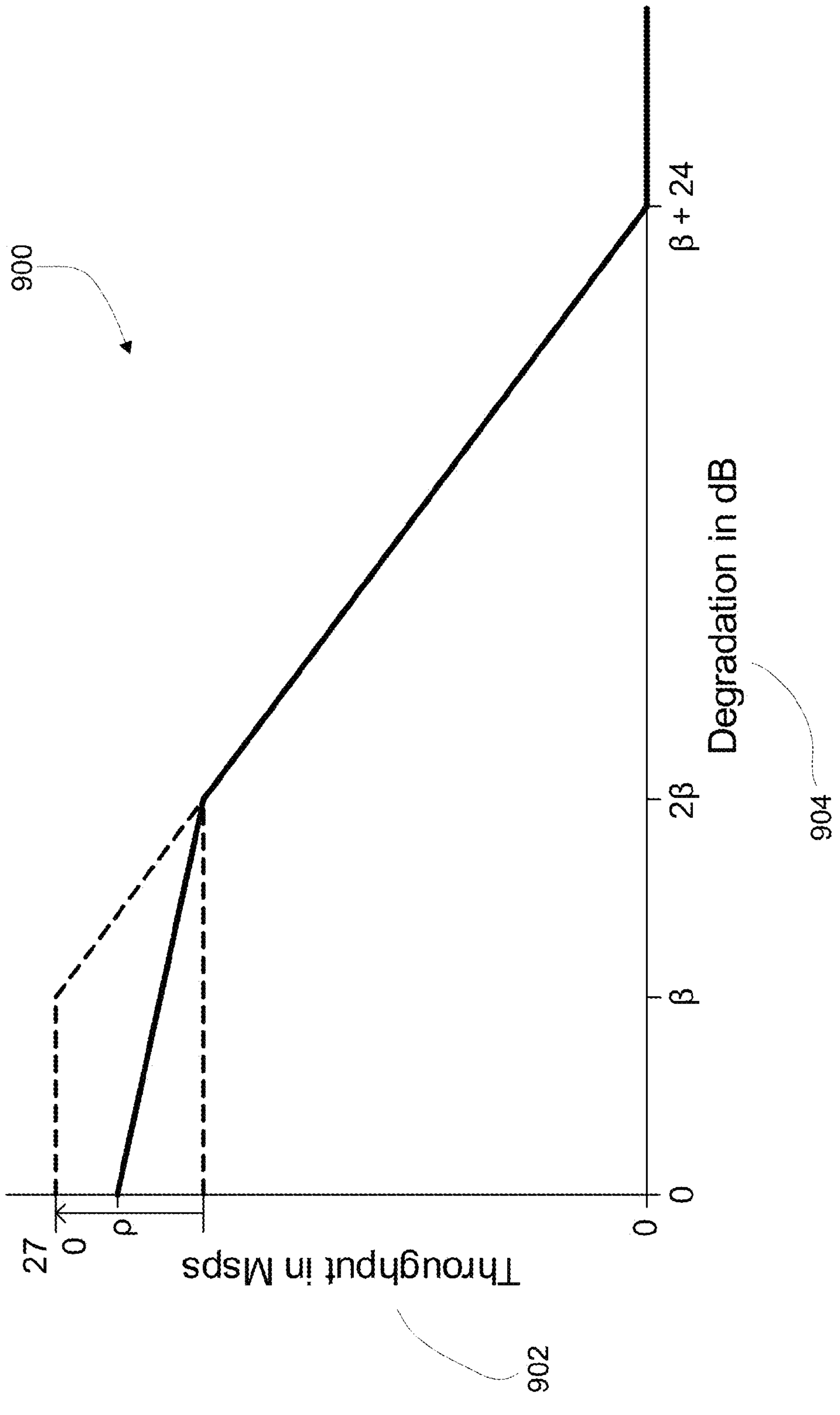
FIG. 9 is a graph illustrating conversion of channel degradation to throughput according to an embodiment of the present disclosure.

At 618, which is optional, the subcarrier degradations may be converted to throughputs. Referring now to FIG. 9, a graph 900 illustrates the total channel throughput 902 in Msps (million symbols per second) on the vertical axis and total channel degradation 904 in dB along the horizontal axis. Graph 900 illustrates the relationship between degradation and throughput may be linear and may track very closely to 3 dB per modulation step over much of its range.

If all MoCA transmitters had the same maximum transmission level (MTL), and if the selected MTL was flat across all frequencies, the slope of graph 900 would extend upward to the maximum throughput of 270 Msps for MoCA 1.x communications. However, MoCA modems differ in maximum transmit levels, and transmit levels are not flat across all frequencies. The section of the graph 900 with decreased slope models these effects.

The graph 900 introduces two more control parameters used to tune the MQI model to match experimental results. Beta ($\beta$) represents the MoCA transmitter's level deviation in dB from nominal. Under the MoCA 1.x standard, this is less than 24 dB. Rho (ρ), represents the ratio of the actual throughput to maximum possible throughput above the knee at 2β and has a value between 0 and 1.

MoCA modems have to assign modulation formats in whole numbers of bits. The MQI model tries to match experimental results by using a continuous function to generate estimated throughput from effective degradation. Although rounding to whole numbers could be used when converting degradation to throughput, the MQI model would be more susceptible to having erratic jumps in level or unobtainable values.

At 620, which is also optional, the subcarrier throughputs may be summed to estimate the channel throughput. As discussed above, in some embodiments which quantify MoCA communication suitability from degradations values, the subcarrier degradations are summed to estimate channel degradation. For simplicity, the graph 900 illustrates channel throughput values rather than subcarrier throughput values. The values illustrated in graph 900 may be divided by 224 (the number of data transmitting subcarriers 403 in a MoCA 1.x channel) to calculate the throughput estimates per subcarrier. Summing these gives an estimated throughput for the channel.

At 622, a quantification or MQI score is generated for the cable segment under test in the direction of test. An MQI score may be calculated from subcarrier degradations, subcarrier throughputs, channel degradations or channel throughput. Generating an MQI score at 622 may also be optional, that is, any of the subcarrier degradations, subcarrier throughputs, channel degradations or channel throughput may be substituted for the MQI score as a quantification of the suitability of the segment to support MoCA communications. In some embodiments, an MQI score is calculated on a scale of 0 to 10 where 0 is the lowest quality and 10 is the highest quality. Calculating a graduated MQI score instead of substituting a degradation or throughput value provides the advantage of having easily comprehensible and comparable quantification scores.

In some embodiments, MQI scores are assigned from 0 to 10 based on the total channel throughput. MQI scores of 8 to 10 indicate that MoCA performance on the network should be good, 5 to 7 should be fair, and 0 to 4 should indicate unacceptable MoCA performance. In some embodiments, MQI scores may have resolution of tenths of units rather than merely whole numbers.

Some guidelines considered when defining the MQI scoring range were: the thresholds that delineate the scores do not need to be evenly spaced; the thresholds should be far enough apart that random variations in measured response function values do not cause the score to change by more than 1 unit. Experimental results identified that it was difficult to get MoCA 1.x modems to communicate at all when the total channel throughput was below 80 Msps and it was difficult to get total channel throughput values in excess of 250 Msps. Accordingly, in some embodiments, a mapping of MQI scoring range to total channel throughput estimates are assigned according to this table:

| Estimated Channel Throughput | MQI Score |
|---|---|
| Less than 100 | 0 |
| 100 to 120 | 1 |
| 120 to 140 | 2 |
| 140 to 160 | 3 |
| 160 to 180 | 4 |
| 180 to 192 | 5 |
| 192 to 204 | 6 |
| 204 to 216 | 7 |
| 216 to 228 | 8 |
| 228 to 240 | 9 |
| 240 or higher | 10 |

Figure 10:
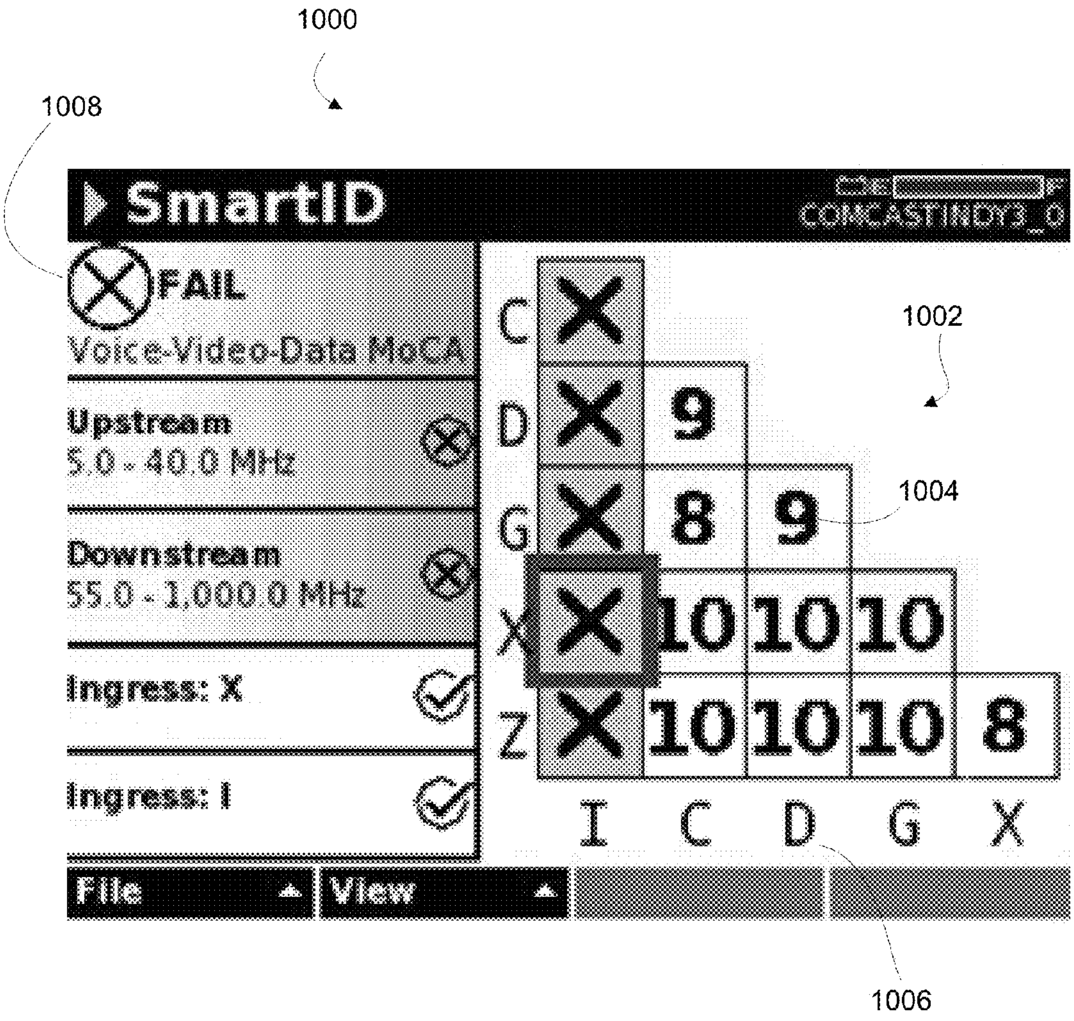
FIG. 10 illustrates an example visual interface according to an embodiment of the present disclosure.

FIG. 10 illustrates an example visual interface 1000 from a multi-test analyzer after performing several tests, including predicting MoCA performance by calculating MQI scores. The other tests, such as voice, CATV upstream and CATV downstream, and their results that form part of visual interface 1000 are unrelated to the present disclosure. For example, in FIG. 10, the test summary 1008 reports "FAIL" because the CATV upstream and CATV downstream tests failed (identified by the circled X's). This failed result is unrelated to the successful MoCA performance test described below.

The pyramid of boxes 1002 on the right side of the visual interface 1000 displays an MQI score 1004 in each box. Each box represents a bi-directional signal path between a pair of devices 1006 connected in the network environment. The networked devices are identified in the pyramid by one of the labels "C", "D", "G", "X", "Z" and "I". Typically, the "I" label is reserved for a transceiver placed at the point of entry (POE) of the cable network. MQI scores are not typically calculated for communications with the transceiver at the POE as it does not represent a device that will be present in the network environment after testing. Instead, as in FIG. 10, the boxes associated with device "I" are filled with X's instead of MQI scores. Other labels and different combinations of devices in the network are possible.

Each box in the pyramid 1002 reports the lower of the two MQI scores 1004 calculated in both directions between the associated pair of devices. Reporting the lowest MQI score provides the following advantages: less data needs to be displayed and reviewed by the user; many of the networks using MoCA have equal frequency response in both directions yielding identical scores in both directions, making reporting both MQI scores redundant; and reporting the lowest MQI score is intuitive because users typically think of signal paths, not directions, when considering repairs because repairs replace cable segments affecting both directions. Alternatively, both scores may be averaged in some manner, or the maximum MQI score may be reported.

Although not illustrated in FIG. 10, green shading of each box in the pyramid 1002 may identify that the reported MQI score 1004 is equal to or above a pre-configured threshold value. Conversely, any box with an MQI score 1004 below the threshold may be shaded red to emphasize a failed result. A typical threshold setting may be an MQI score of 5. This example visual interface 1000 may be provided as part of measurement systems 200, 300, analyzer 206 or test unit 302.

The present disclosure has described quantifying the suitability of a single network segment. It allows computation of MQI scores in each direction between each pair of devices on the network. An aggregate MQI score for the whole coax cable network 100 in all directions is also desirable. An aggregate MQI score may be calculated from the estimated channel degradations or throughputs of each segment rather than from the individual segment MQI scores because the degradation or throughput estimates have higher resolution than the MQI scores.

Aggregate network MQI scores may be calculated in many different ways. For example, averaging the throughputs of all segments/directions or identifying the minimum throughput, then converting that value to a score using the same table of thresholds used for individual segment scores. The averaging method represents the whole network 100 well but may obfuscate paths that under perform compared to the other paths. The minimum method draws greater attention to any segment or path whose frequency response is unsuitable for MoCA. These two aggregation methods may also be combined to balance these trade-offs. While putting greater emphasis on those segments that need to be improved, any network improvement that raises an individual segment's score should also raise the aggregate score slightly.

The present disclosure has also described quantifying suitability to support MoCA 1.x communications. The MoCA 2.0 standard adds several enhancements without changing the basic concepts of MoCA 1.x. MoCA 2.0 enhancements are publicly described online at http://www.etimes.com/General/PrintView4217863 (last accessed Dec. 9, 2011). Under MoCA 2.0: channel width is increased from 50 to 100 MHz but keeps the same center frequencies for primary channels; secondary MoCA channel frequencies are introduced 25 MHz higher for bonding two MoCA channels with a 25 MHz unused gap between them; the number of total subcarriers in a channel is increased from 256 to 512 but maintains the same spacing and alignment; the number of available subcarriers is increased from 224 to 480; each available subcarrier in MoCA 1.x is also an available subcarrier in MoCA 2.0; and MoCA 2.0 adds 512 and 1024 QAM to the eight modulation formats supported in MoCA 1.x.

Embodiments of the present disclosure, including the MQI model described, can easily be adapted to the new MoCA 2.0 standard when MoCA 2.0 compliant devices become available. The structure of the MQI model does not change; rather, embodiments of the present disclosure will measure more frequencies, establish score thresholds appropriate for the faster rates that MoCA 2.0 provides, and use an aggregate MQI scoring concept to show the performance of bonded MoCA channels.

Figure 11:
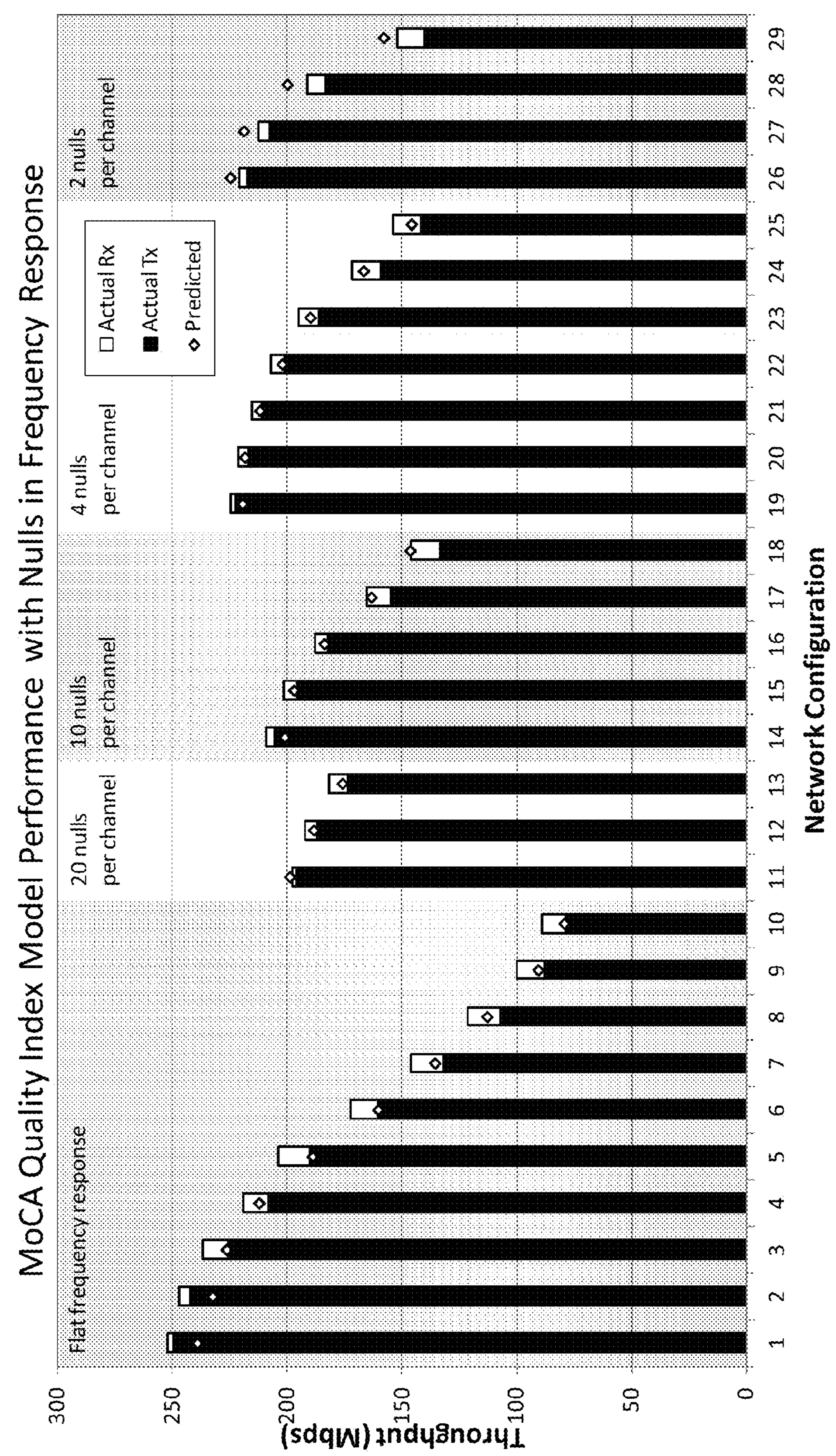
FIG. 11 is a graph comparing MoCA Quality Index (MQI) predicted performance according to an embodiment of the present disclosure compared with measured MoCA performance.
Figure 12:
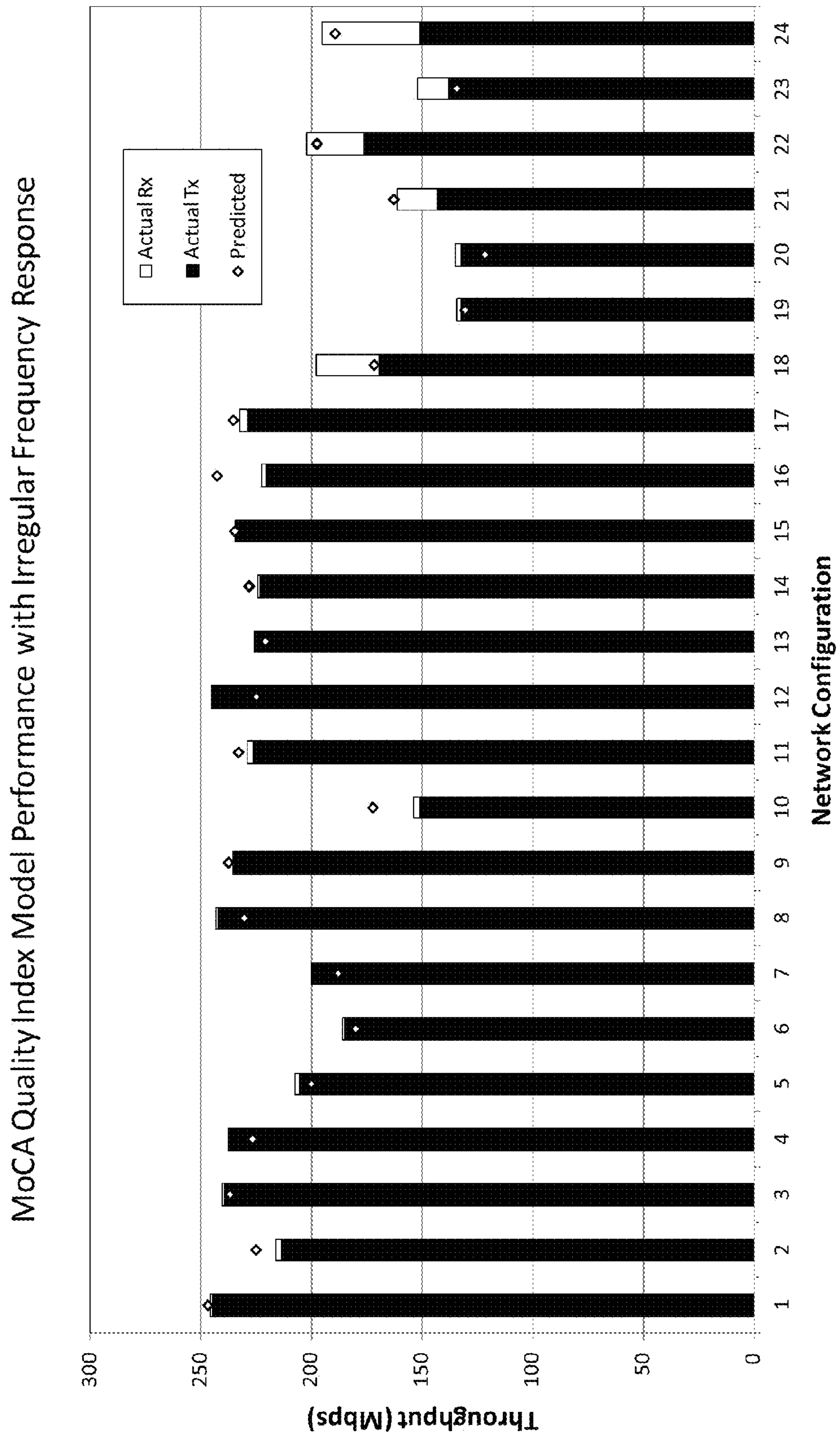
FIG. 12 is a further graph comparing MoCA Quality Index (MQI) predicted performance according to an embodiment of the present disclosure compared with measured MoCA performance.

Turning now to FIGS. 11 and 12, an MQI model was constructed in an analyzer using the following control parameter specifications: $\delta=-52.8$ dB, $\beta=4.19$ dB, $\rho=0.54$, $\tau=-0.17$, $\kappa=17$, $\mu=0.72$ dB/MHz and $\phi=8.2$ dB. This analyzer was used to predict MoCA performance over various different network cable segments. MoCA hardware was then connected across the same network cable segments and actual MoCA transmission (Tx) and reception (Rx) rates were measured.

In FIG. 11, the 29 different network cable segments tested comprised five groups: network segment simulating flat frequency response and network segment simulating 20, 10, 4 or 2 nulls per channel. In FIG. 12, the 24 further network cable segments tested had one or less nulls per channel.

In both FIGS. 11 and 12, each network segment is numbered and listed across the horizontal axis. MoCA throughput (Mbps) is measured on the vertical axis. The MoCA performance predicted according to the present disclosure is depicted as a hollow diamond. The actual MoCA transmission rate (actual Tx) is illustrated as a solid black bar. The actual MoCA receive rate (actual Rx) is illustrated as a hollow black bar. In each configuration, the predicted MoCA results closely matched the actual MoCA transmission and received rates.

As known to a person skilled in the art, the network, processor, memory, transceivers, transmitters, receivers, probes, devices and other computer features described in this disclosure may be implemented in hardware, software or a combination of both. They may form part of an independent, distributed, share or other configuration of computing elements capable of storing, accessing, reading and executing transitory and/or non-transitory computer instructions.

We claim:

1. A method for quantifying the suitability of a coax network segment to support Multimedia over Coax Alliance (MoCA) communications from a first end of the segment to a second end of the segment, the method comprising:

generating at the segment's first end and transmitting therethrough a test signal having power levels and frequencies associated with MoCA communications spanning multiple subcarrier frequency ranges;

receiving the test signal through the segment's second end and determining power levels of the received test signal;

determining a frequency response function from the power levels of the transmitted and received test signals;

determining a channel degradation reference based on the highest power level of the response function and a predetermined MoCA design reference response;

calculating subcarrier degradation, for each subcarrier frequency range in the response function, in accordance with the difference between the channel degradation reference and the response function at the subcarrier's frequency range; and quantifying the suitability of the segment to support MoCA communications from the first end to the second end in accordance with the subcarrier degradation of all subcarriers in the response function.

2. The method of claim 1 wherein quantifying the suitability of the segment further comprises:

calculating subcarrier throughput, for each subcarrier frequency range in the response function, in accordance with the subcarrier degradation of each subcarrier;

estimating channel throughput by summing all subcarrier throughputs; and generating a MoCA Quality Index (MQI) score in accordance with the channel throughput.

3. The method of claim 2 wherein calculating subcarrier throughput further comprises calculating subcarrier throughput, for each subcarrier in the response function, in accordance with a predetermined MoCA transmitter level deviation from nominal ($\beta$) and in accordance with a predetermined ratio of actual to maximum possible throughput ($\rho$) when subcarrier degradation is above $2\beta$.

4. The method of claim 1 wherein determining the frequency response function further comprises:

adjusting the response function to compensate for MoCA adaptive equalization by:

dividing the response function into a predetermined number of frequency bands ($\kappa$);

averaging the response function values within each band;

adjusting the averaged response function values such that none are more than a predetermined amount ($\phi$) below the highest averaged response function value;

calculating an average level of all adjusted averaged response function values; and adjusting the response function in accordance with the average level.

5. The method of claim 4 wherein averaging the response function values within each band comprises:

calculating a left trace by tracing the averaged response function values from low to high frequency limiting the slope between adjacent trace values by a predetermined maximum ($\mu$);

calculating a right trace by tracing the averaged values from high to low frequency limiting the slope between adjacent trace values by μ; and calculating the averaged response function values by averaging the left and right traces.

6. The method of claim 1 further comprising compensating for MoCA transmission pre-equalization.

7. The method of claim 1 wherein:

transmitting the test signal further comprises transmitting frequencies that are at the edges of MoCA subcarrier frequency ranges; and determining the response function further comprises adjusting the response function for each subcarrier frequency range by compensating for tilt between the edge frequencies of each subcarrier frequency range.

8. The method of claim 7 wherein compensating for tilt further comprises:

calculating, for each subcarrier frequency range, a slope between response function levels at the edge frequencies of the subcarrier frequency range; and adjusting, for each subcarrier frequency range, the response function in accordance with the slope and a predetermined tilt effect coefficient (T).

9. The method of claim 1 wherein determining the response function further comprises adjusting the response function by performing near-noise correction in accordance with minimum measurable responses at each frequency of the response function.

10. The method of claim 1, further comprising:

repeating the method of claim 1 for a plurality of segments of a coax network;

repeating the method of claim 1 for the plurality of segments of the coax network reversing the direction of transmitting and receiving through each segment; and quantifying the suitability of the coax network to support MoCA communications in accordance with the quantifying of suitability of each segment to support MoCA communications in each direction.

11. A system for quantifying the suitability of a coax network segment to support Multimedia over Coax Alliance (MoCA) communications from a first end of the segment to a second end of the segment, the system comprising:

a transmitter for connecting to the segment's first end to generate and transmit a test signal having power levels and frequencies associated with MoCA communications spanning multiple subcarrier frequency ranges;

a receiver for connecting to the segment's second end to record a received signal in response to transmission of the test signal by the transmitter;

a processor for executing non-volatile computer executable instructions;

a memory connected to the processor for storing non-volatile computer executable instructions including instructions for:

receiving the test signal;

and determining power levels thereof;

determining a frequency response function from the power levels of the transmitted test signal and the received test signal;

determining a channel degradation reference based on the highest power level of the response function and a predetermined MoCA design reference response;

calculating subcarrier degradation, for each subcarrier frequency range in the response function, in accordance with the difference between the channel degradation reference and the response function at the subcarrier's frequency range;

quantifying the suitability of the segment to support MoCA communications from the first end to the second end in accordance with the subcarrier degradation of all subcarriers in the response function; and an output connected to the processor and the memory for outputting the quantified results of executing the computer executable instructions.

12. The system of claim 11 wherein the instructions for quantifying the suitability of the segment comprise further non-volatile computer executable instructions for:

calculating subcarrier throughput, for each subcarrier frequency range in the response function, in accordance with the subcarrier degradation of each subcarrier;

estimating channel throughput by summing all subcarrier throughputs; and generating a MoCA Quality Index (MQI) score in accordance with the channel throughput.

13. The system of claim 12 wherein the instructions for calculating subcarrier throughput comprise further non-volatile computer executable instructions for calculating subcarrier throughput, for each subcarrier in the response function, in accordance with a predetermined MoCA transmitter level deviation from nominal (β) and in accordance with a predetermined ratio of actual to maximum possible throughput (ρ) when subcarrier degradation is above 2β.

14. The system of claim 11 wherein the instructions for determining the response function comprise further non-volatile computer executable instructions for:

adjusting the response function to compensate for MoCA adaptive equalization by:

dividing the response function into a predetermined number of frequency bands (κ);

averaging the response function values within each band;

adjusting the averaged response function values such that none are more than a predetermined amount (ϕ) below the highest averaged response function value;

calculating an average level of all adjusted averaged response function values; and adjusting the response function in accordance with the average level.

15. The system of claim 14 wherein the instructions for averaging the response function values within each band comprise further non-volatile computer executable instructions for:

calculating a left trace by tracing the averaged response function values from low to high frequency limiting the slope between adjacent trace values by a predetermined maximum (μ);

calculating a right trace by tracing the averaged values from high to low frequency limiting the slope between adjacent trace values by μ; and calculating the averaged response function values by averaging the left and right traces.

16. The system of claim 11 comprising further non-volatile computer executable instructions for compensating for MoCA transmission pre-equalization.

17. The system of claim 11 wherein the test signal further comprises frequencies that are at the edges of MoCA subcarrier frequency ranges; and wherein the instructions for determining the response function comprise further non-volatile computer executable instructions for adjusting the response function for each subcarrier frequency range by compensating for tilt between the edge frequencies of each subcarrier frequency range.

18. The system of claim 17 wherein the instructions for compensating for tilt comprise further non-volatile computer executable instructions for:

calculating, for each subcarrier frequency range, a slope between response function levels at the edge frequencies of the subcarrier frequency range; and adjusting, for each subcarrier frequency range, the response function in accordance with the slope and a predetermined tilt effect coefficient (T).

19. The system of claim 11 wherein the instructions for determining the response function comprise further non-volatile computer executable instructions for adjusting the response function by performing near-noise correction in accordance with minimum measurable responses at each frequency of the response function.

20. The system of claim 11, comprising further non-volatile computer executable instructions for:

repeating the non-volatile computer executable instructions for all segments of a coax network;

repeating the non-volatile computer executable instructions for all segments of the coax network reversing the direction of transmitting and receiving through each segment; and quantifying the suitability of the coax network to support MoCA communications in accordance with the quantifying of suitability of each segment to support MoCA communications in each direction.

* * * * *